US005493256A

United States Patent [19]
Kawasaki et al.

[11] Patent Number: 5,493,256
[45] Date of Patent: Feb. 20, 1996

[54] PHASE LOCKED SIGNAL GENERATOR TO PRODUCE A CLOCK SIGNAL IN PHASE WITH A TRIGGER

[75] Inventors: Somei Kawasaki, Urawa; Masami Iseki, Yokohama; Hironari Ebata, Yamato, all of Japan

[73] Assignee: Canon Kabushiki Kaisha, Tokyo, Japan

[21] Appl. No.: 257,290

[22] Filed: Jun. 9, 1994

[30] Foreign Application Priority Data

Jun. 11, 1993 [JP] Japan .................................. 5-140490

[51] Int. Cl.⁶ ........................................................ H03L 7/00
[52] U.S. Cl. ............................. 331/1 A; 331/10; 331/14
[58] Field of Search .............................. 331/100, 11, 18, 331/20, 14, 1 A; 348/536, 540

[56] References Cited

U.S. PATENT DOCUMENTS 3,921,095  11/1975  Chu ............................................. 331/1 A
4,875,108  10/1989  Minuhin et al. ........................... 360/51

Primary Examiner—Robert J. Pascal
Assistant Examiner—David H. Vu
Attorney, Agent, or Firm—Fitzpatrick, Cella, Harper & Scinto

[57] ABSTRACT

A phase-locked signal generator which performs phase-locked control of the output of a triangular-wave VCO when a trigger signal is not inputted, and which performs, when the trigger signal is inputted, short interval suspension of oscillation of the triangular-wave VCO, and detection of a phase difference between the trigger signal and the reference clock signal by a successive phase measuring portion after the short interval by using the triangular-wave signal, thereby obtaining phase data. The measured phase data is held until the next trigger signal, and the phase of the triangular-wave VCO is controlled in accordance with the phase data so that the triangular-wave signal has a fixed phase with respect to the reference clock signal. A square-wave signal outputted from the triangular-wave VCO is used as the phase-locked clock signal. This makes it possible to generate the phase-locked clock signal at higher stability than a conventional circuit, and to improve jitter without using the multiplied frequency of the phase-locked clock signal.

13 Claims, 10 Drawing Sheets

PHASE LOCKED SIGNAL GENERATOR TO PRODUCE A CLOCK SIGNAL IN PHASE WITH A TRIGGER

BACKGROUND OF THE INVENTION

1. Field of the Invention

The present invention relates to a phase locked signal generator that generates a clock signal in phase with a phase trigger signal.

2. Description of Related Art

EXAMPLE 1

Conventionally, a phase locked signal generator as shown in FIG. 1 is used to generate a sampling clock signal in phase with the horizontal synchronizing signal of an input video signal in order to store the video signal into a semiconductor video memory.

FIG. 2 is a timing diagram illustrating the operation of the phase locked signal generator of FIG. 1. In this figure, (a) shows the horizontal synchronizing signal HD whose rising edge is used as a trigger signal, and (b) shows the output signal from an inverter 17 of FIG. 1. When the HD signal is H level, a square pulse train whose period is $2\tau$ is oscillated, and produced from the output terminal of the inverter 17 by the interaction between an NAND gate 15 and a delay line 16 having a delay time of $\tau$ (interval [1]). In contrast, when the HD signal is L level, the output of the inverter 17 is fixed to L level because the output of a NAND gate 15 is forced to H level (interval [2]). In other words, a phase locked clock signal in phase with the rising edge (trigger signal) of the HD signal is outputted from the inverter 17 when the duration of L level of the HD signal is identical for respective horizontal intervals, and is much longer than the delay time $\tau$.

EMBODIMENT 2

In a laser beam printer, a photosensitive drum is scanned at a constant speed with a laser beam so that toner is deposited on irradiated locations. Subsequently, the toner is transferred to recording paper, thereby forming image information on the paper. During this operation, a horizontal synchronizing signal HD is generated using a beam detecting mirror to effect horizontal synchronization of the laser irradiation. The beam detecting mirror is disposed at a fixed position with regard to the photosensitive drum, and a laser beam reflected from the mirror is converted into an electric pulse train by a photoelectric converter, thereby generating the horizontal synchronizing signal HD.

Conventionally, the laser beam printer system employs a phase locked signal generator as shown in FIG. 3. In this figure, an $Nf_o$ crystal oscillator 18 produces a clock signal whose frequency is N times the frequency $f_o$ of a required phase locked clock signal. The clock signal is inputted to an N counter 19, and a clock signal whose frequency is $f_o$ is outputted when the clear terminal CL of the counter 19 is placed at H level. In contrast, when the HD signal applied to the clear terminal CL of the N counter 19 falls to L level, the N counter 19 is cleared, and its output terminal is fixed at L level. Thus, the N counter 19 starts counting at the rising edge of the HD signal. This makes it possible to generate the phase locked clock signal in synchronism with the edge.

In FIG. 4, (a) shows the HD signal of FIG. 3, and (b) shows the output signal of the N counter 19. In (b) of FIG. 4, $t_j$ designates jitter of the phase locked signal. The amount of the jitter is equal to one period of the $Nf_o$ clock signal.

In the first conventional example, which employs the gated oscillator as explained referring to FIGS. 1 and 2, the frequency of the clock signal is determined by the delay time of the delay line 16. This gives rise to a problem in that the frequency stability of the phase locked clock signal is insufficient, and the phase error is accumulated. More specifically, since the phase lock accuracy obtained by the first clock of the horizontal scanning is gradually degraded as the number of the clock increases, the image quality is degraded at the rightmost portion of the screen. Therefore, the first example is not suitable for a high definition image consisting of a great number of pixels, and hence, cannot be applied to the laser beam printer system.

In the second conventional example, which employs the counter reset as explained with reference to FIGS. 3 and 4, since the frequency of the phase locked signal depends upon the frequency of the crystal oscillator 18, the above-mentioned problem is eliminated. The second example, however, has a problem in that the phase locked accuracy is determined by the multiple N of the frequency multiplied clock signal $N_o$. For example, a multiple no less than eight is necessary for the laser beam printing system which prints digital images such as characters.

The frequency of the phase locked clock signal is proportional to the square of the definition of an image, and to a printing speed. In particular, improvement in the definition and the printing speed of the laser beam printing system is greatly required, and so the frequency of the phase locked clock signal is on an upward trend. For example, since a color laser beam printer system which prints video images tries to obtain higher quality images by controlling toner dot positions of respective colors (yellow, cyan, magenta and black), higher synchronizing accuracy will be required, and a frequency multiple of about 32 will be necessary. More specifically, if a desired frequency of the synchronizing clock is 20 MHz, the frequency of the crystal oscillator ahead of the counter must be 640 MHz, which is rather difficult to achieve.

SUMMARY OF THE INVENTION

In view of the above-described problem, an object of the present invention to provide a phase-locked signal generator which can maintain a desired frequency and phase stably and accurately.

According to a first aspect of the present invention, there is provided a phase-locked signal generator producing a phase-locked clock signal in phase with a trigger signal, comprising:

reference clock signal generating means for generating a reference clock signal having the same frequency as the phase-locked clock signal;

reset pulse generating means for generating a reset pulse in response to the trigger signal;

triangular-wave generating means for generating a triangular-wave signal, whose frequency is identical to that of the phase-locked clock signal, from a particular phase after a predetermined time has elapsed from the input of the trigger signal, the triangular-wave generating means suspending its oscillation for the predetermined time in response to the reset pulse;

phase detecting means for detecting a phase difference between the triangular-wave signal and the reference clock signal, and for holding the detected phase difference; and phase control means for controlling the triangular-wave generating means after the phase detection by the phase detecting means, so that the phase difference between the reference clock signal and the triangular-wave signal is maintained at the phase difference held by the phase detecting means.

Here, the phase detecting means may comprise:

a first comparator comparing the triangular-wave signal with a reference voltage, and outputting the comparison result in the form of a digital signal;

holding means for sequentially holding the digital signal outputted from the first comparator at a particular phase of the reference clock signal during a phase detecting period and for outputting held digital signals as a digital reference voltage; and a D/A converter converting the digital reference voltage outputted from the holding means into an analog signal, and outputting the analog signal as the reference voltage, wherein the reference voltage is controlled to successively approximate a voltage of the triangular-wave signal at the particular phase of the reference clock signal.

The holding means may acquire the output of the first comparator by a predetermined number of times after the occurrence of the reset pulse, and determines the reference voltage after the last acquisition.

The phase control means may comprise a phase comparator which detects a phase difference between the output of the first comparator and the reference clock signal after the reference voltage has been determined, and which supplies the triangular-wave generating means with a control signal corresponding to the phase difference which has been detected by the phase comparator.

The phase comparator may be set in a hold state in response to the reset pulse, the phase comparator holding the control signal in the hold state, and wherein the reset pulse generating means controls the pulse width of the reset pulse by the control signal held by the phase comparator.

The triangular-wave generating means may comprise a capacitor, and a constant current source supplying a constant current to the capacitor, the constant current being controlled by the control signal outputted from the phase comparator.

The triangular-wave generating means may generate both the triangular-wave signal and the phase-locked clock signal.

The first comparator may be a binary comparator that outputs a binary signal.

The phase-locked signal generator may further comprise a second comparator comparing the triangular-wave signal with a substantially central voltage of the triangular-wave signal, and a first switch supplying the phase detecting means with one of the outputs of the first comparator and the second comparator, wherein the pulse width of the first comparator is broadened without changing a value of the output of the first comparator at the particular phase of the reference clock signal.

According to a second aspect of the present invention, there is provided an apparatus for generating a clock signal whose phase is synchronized with a trigger signal, the apparatus comprising:

means for generating a reference clock signal;

means for generating, after being reset by the trigger signal, a first clock signal whose frequency is determined in accordance with a control signal;

phase detecting means for detecting a phase difference between the first clock signal and the reference clock signal, the detecting being started by the trigger signal, and the phase detecting means holding the detected phase difference after detection;

means for generating a second clock signal whose phase differs from that of the first clock signal by an amount equal to the detected phase difference held by the phase detecting means;

means for generating the control signal supplied to the means for generating a first clock signal by comparing the phase of the second clock signal and the reference clock signal, the means for generating the control signal holding, during the detection of the phase difference, the control signal obtained by the preceding detection by the phase detecting means; and means for generating the first clock signal as the clock signal to be generated.

According to the present invent ion, the synchronizing clock signal in phase with the trigger signal is generated as follows:

(1) The generation of the triangular-wave signal is stopped for a fixed elapsed time after the trigger signal (that is, the rising edge of the horizontal synchronizing signal) is inputted.

(2) After the elapsed time, the generation of the triangular-wave signal, whose frequency is identical to that of the reference clock signal, is started from the predetermined phase. In other words, a triangular-wave signal in phase with the trigger signal is generated.

(3) The phase difference between the triangular-wave signal and the reference clock signal is detected, and a reference voltage corresponding to the phase difference is held. More specifically, the triangular-wave signal is compared with the reference voltage at each rising edge (or falling edge) of the reference clock signal, and the reference voltage is successively controlled so that it agrees with the triangular-wave signal at respective edges. Thus, the reference voltage is held which is substantially equal to the voltage of the triangular-wave signal at respective edges. In other words, the phase difference between the triangular-wave signal and the reference clock signal is held in the form of the reference voltage. The comparison between the triangular-wave signal and the reference voltage is carried out for several clock intervals to determine the reference voltage. Thus, the phase difference between the trigger signal and the reference clock signal is detected in terms of the triangular-wave signal, and the reference voltage corresponding to the phase difference is held.

(4) When the reference voltage is held, phase control between the reference clock signal and the triangular-wave signal is started so that the stability of the triangular-wave signal is maintained. Thus, the triangular-wave signal having a fixed phase difference with the reference clock signal is generated on the basis of the reference voltage which has been held. Therefore, the triangular-wave signal is in phase with the trigger signal.

(5) A signal in phase with the triangular-wave signal is outputted as the phase locked clock signal.

Generally speaking, the frequency of the reference clock signal can be set to be highly stable. Accordingly, the triangular-wave signal in phase with the trigger signal can be generated with high stability by storing the reference voltage in the form of a digital signal, for example. Thus, the phase locked clock signal of lesser jitter can be generated stably without using a multiplied frequency of the phase locked clock signal.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 1:
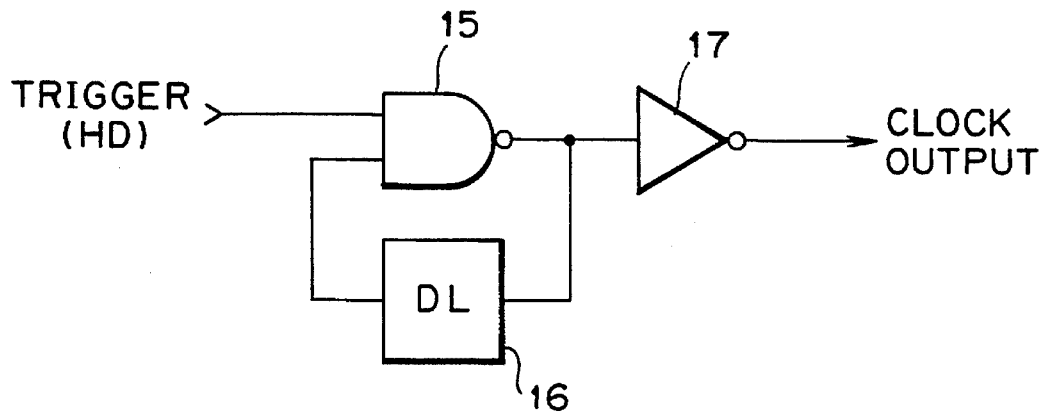
FIG. 1 is a circuit diagram showing a first example of a conventional phase locked signal generator.
Figure 2:
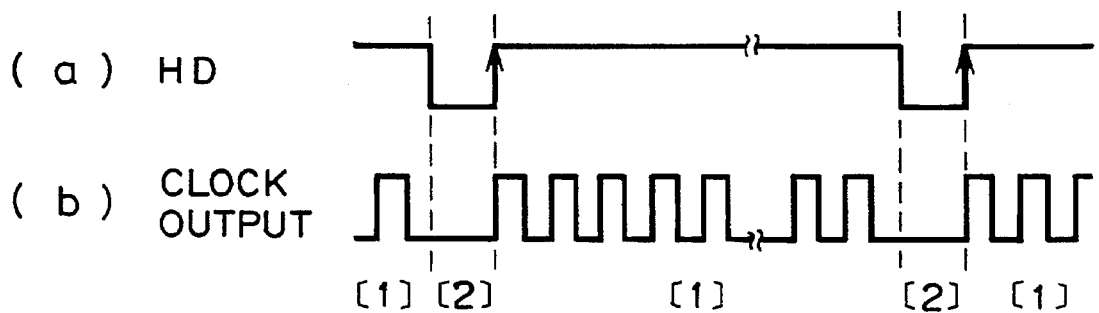
FIG. 2 is a timing diagram illustrating the operation of the conventional phase locked signal generator of FIG. 1.
Figure 3:
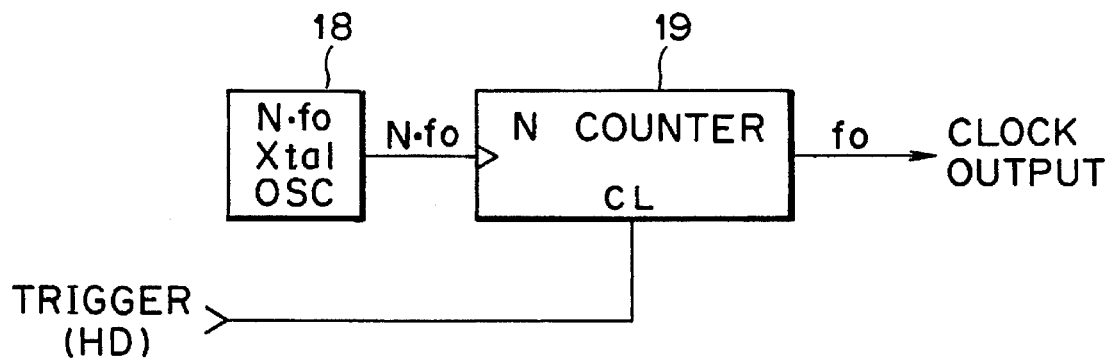
FIG. 3 is a block diagram showing a second example of a conventional phase locked signal generator.
Figure 4:
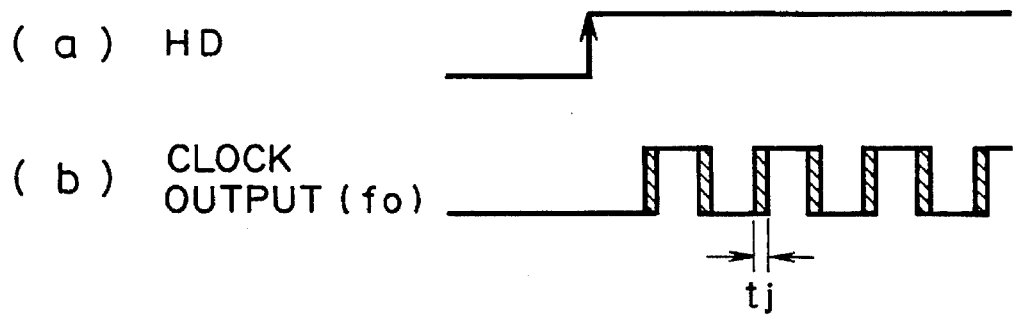
FIG. 4 is a timing diagram illustrating the operation of the conventional phase locked signal generator of FIG. 3.
Figure 5:
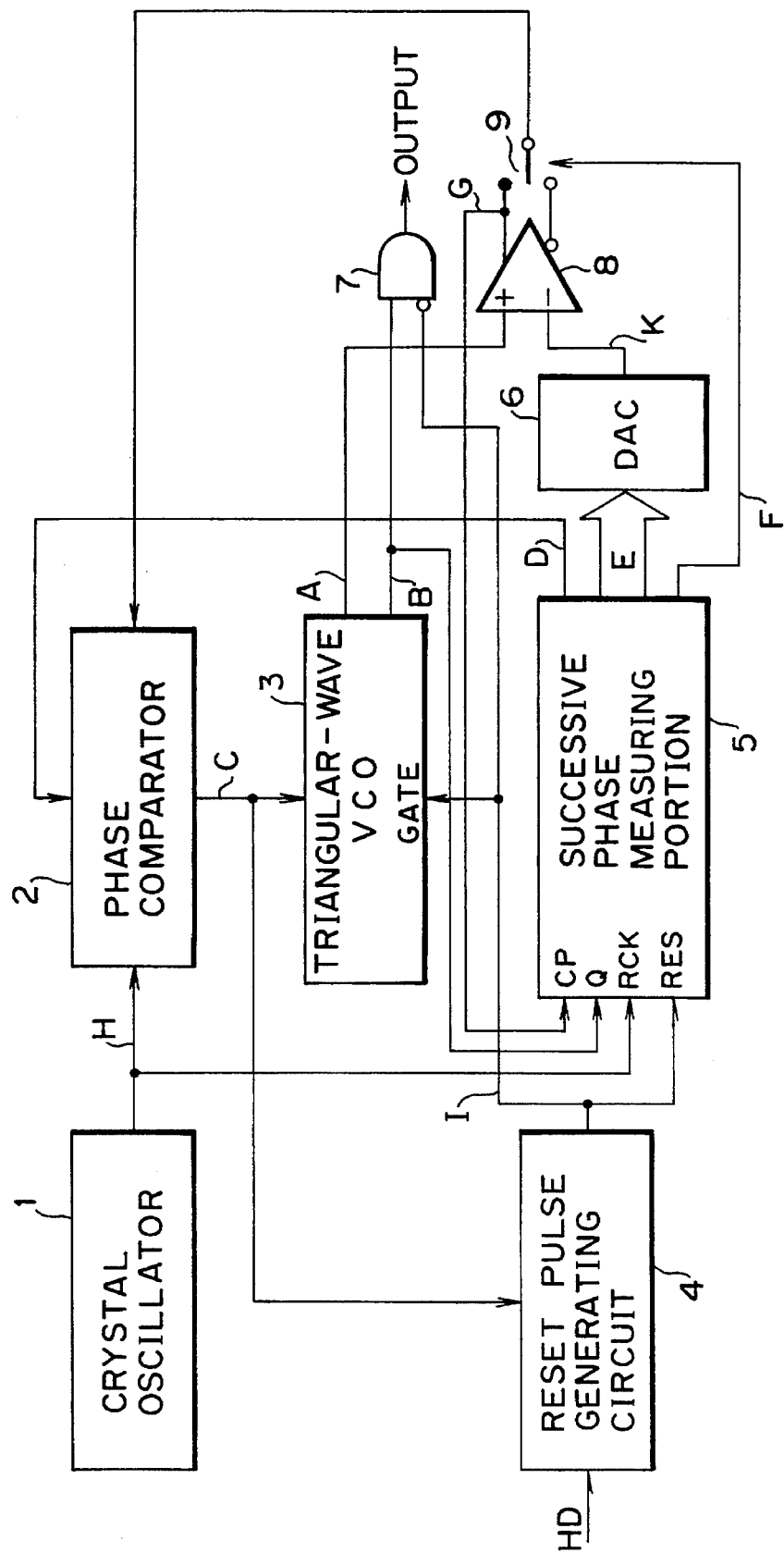
FIG. 5 is a block diagram showing a first embodiment of a phase locked signal generator in accordance with the present invent ion.
Figure 6:
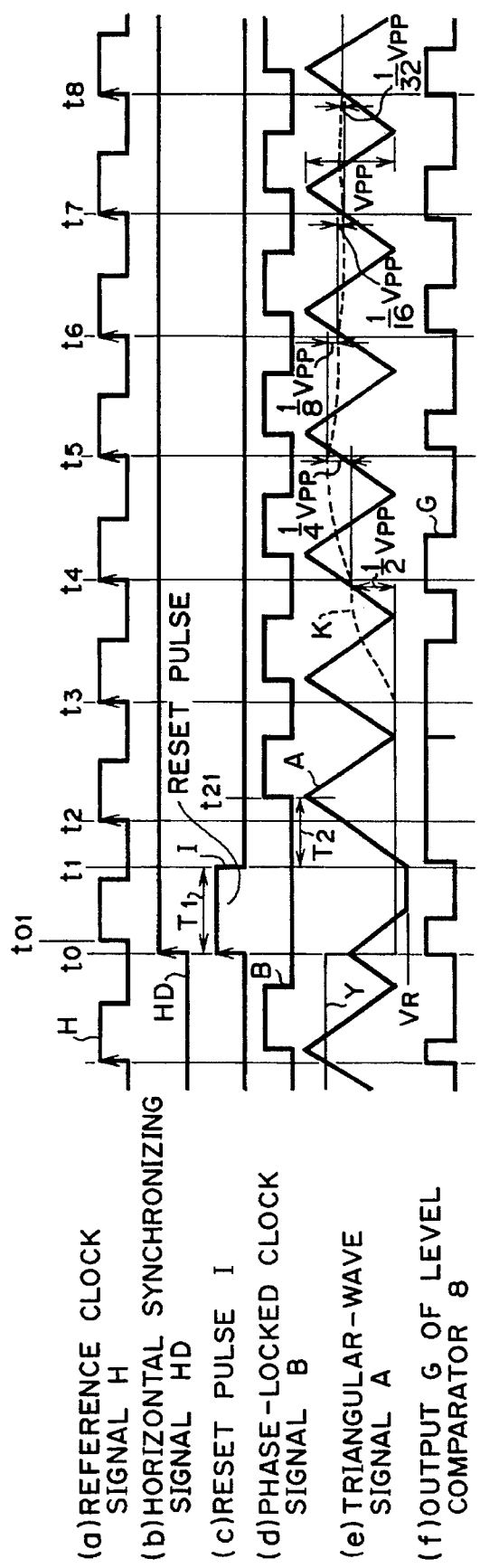
FIG. 6 is a timing diagram illustrating the operation of the first embodiment in FIG. 5.

FIG. 5 is the entire block diagram showing a first embodiment of a phase locked signal generator in accordance with the present invention, and FIG. 6 is a timing diagram illustrating the operation principle of the first embodiment. This embodiment is provided with a triangular-wave VCO (Voltage Controlled Oscillator) 3 which generates a triangular-wave signal A as shown in (e) of FIG. 6 and a square-wave signal B (that is, a phase-locked clock signal) as shown in (d) of FIG. 6. The triangular-wave VCO 3 has a gate input GATE for controlling the start and stop of the oscillation.

The triangular-wave signal A is inputted to the noninverting input terminal of a level comparator 8, whereas a reference voltage K outputted from a D/A converter 6 is inputted to the inverting input of the level comparator 8. In this case, it is assumed that the dynamic range of the D/A converter 6 is set between the top and bottom voltages of the triangular-wave signal A as shown in FIG. 6.

The square-wave signal B as shown in (d) of FIG. 6 is inputted to an output gate 7 and an input terminal Q of a successive phase measuring portion 5. The noninverted and inverted outputs of the level comparator 8 are inputted to a switch 9, and the output signal from the switch 9 is applied to a phase comparator 2 as a phase comparison signal. Furthermore, the noninverted output signal G of the level comparator 8 is inputted to an input terminal CP of the successive phase measuring portion 5.

A crystal oscillator 1 generates a clock signal H as shown in (a) of FIG. 6 whose frequency is equal to that of the phase locked clock signal B, and the clock signal H is inputted to the phase comparator 2 as a reference clock signal, and to an RCK input terminal of the successive phase measuring portion 5.

The phase comparison output signal C produced from the phase comparator 2 is supplied to the triangular-wave VCO 3 and a reset pulse generating circuit 4 as a control signal. In addition, the horizontal synchronizing signal HD as shown in (b) of FIG. 6, whose rising edge is used as a trigger signal, is inputted to the reset pulse generating circuit 4 which generates a reset pulse I as shown in (c) of FIG. 6. The reset pulse I starts at the trigger edge of the trigger signal HD, and continues for a fixed duration T1. The reset pulse I is inputted to the gate input terminal GATE of the triangular-wave VCO 3, a reset input terminal RES of the successive phase measuring portion 5, and the output gate 7.

The successive phase measuring portion 5 outputs phase data E supplied to the D/A converter 6 as a digital reference signal, and a phase comparison holding flag D supplied to the phase comparator 2. The most significant bit F of the phase data E is supplied to the control terminal of the switch 9.

With this arrangement, the triangular-wave VCO 3 stops generation of the triangular-wave signal A for a fixed elapsed time T1 from the time t0 of FIG. 6, at which the trigger signal is inputted. After the fixed elapsed time, generation of the triangular-wave signal A, whose frequency is identical to that of the reference clock signal H, is started from a predetermined phase at time t1 of FIG. 6. In other words, a triangular-wave signal A in phase with the trigger signal is generated.

The successive phase measuring portion 5 detects a phase difference between the triangular-wave signal A and the reference clock signal H, and holds the reference voltage K corresponding to the phase difference, as illustrated by the dotted line in (e) of FIG. 6. More specifically, the triangular-wave signal A is compared with the reference voltage K at each rising edge of the reference clock signal H at times t4–t8 of FIG. 6, and the reference voltage K at respective edges is successively controlled so that it approaches the triangular-wave signal A at the edges. Then, the reference voltage K is held which is substantially equal to the voltage of the triangular-wave signal A at the edges (the reference voltage K at time t8 is held in FIG. 6). In other words, the phase difference between the triangular-wave signal A and the reference clock signal H is held in the form of the reference voltage K. The comparison of the triangular-wave signal A and the reference voltage K is carried out for several clock intervals (t4–t8, for example) to determine the reference voltage K. Thus, the phase difference between the trigger signal (the rising edge of the synchronous horizontal signal HD) and the reference clock signal H is detected via the triangular-wave signal A, and the reference voltage K corresponding to the phase difference is held. During the phase measurement, the control signal C supplied from the phase comparator 2 to the triangular-wave VCO 3 is kept constant so that the control of the triangular-wave VCO 3 is maintained at a holding state.

After holding the reference voltage K, the phase comparator 2 is made an active state, and the triangular-wave VCO 3 is controlled by the control signal C. More specifically, the triangular-wave signal A is generated in such a manner that it has a fixed phase difference with the reference clock signal H by determining the phase of the output G from the level comparator 8 on the basis of the reference voltage K which has been held, and by controlling the phase of the signal G to coincide with that of the reference clock signal H. Thus, the triangular-wave signal A is in phase with the trigger signal. A signal in phase with the triangular-wave signal is outputted as the phase locked clock signal.

Figure 7:
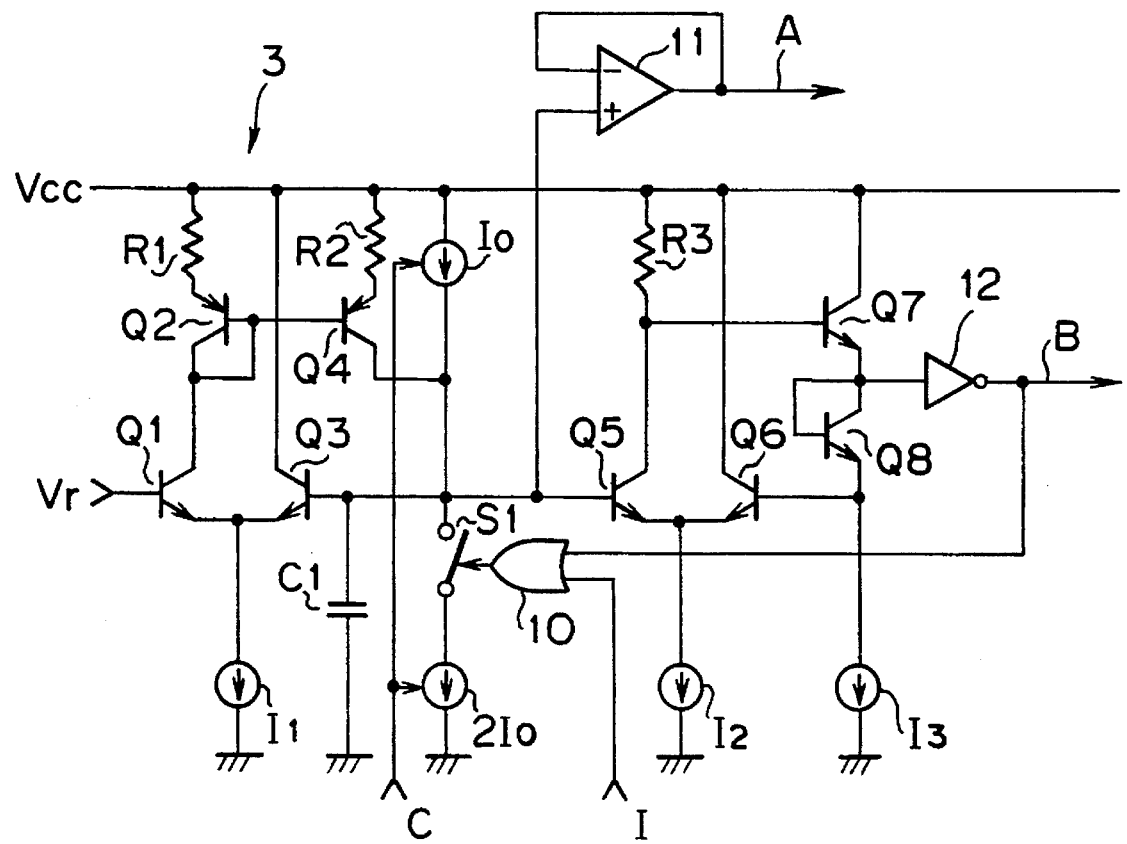
FIG. 7 is a circuit diagram showing a triangular-wave VCO of the first embodiment having a reset function.

FIG. 7 shows in more detail the circuit of the triangular-wave VCO 3 shown in FIG. 5. If a transistor Q5 is OFF, the emitter E of a transistor Q7 becomes H level. The H level is inverted by a NOT circuit 12, and an L level output from the NOT circuit 12 is inputted to an OR circuit 10. Therefore, if the input terminal of the OR gate 10, to which the reset signal I is applied, is at L level, a switch S1 is in the OFF state. Thus, a charge current is supplied to a capacitor C1 from a constant current source Io, thereby increasing the base voltage of the transistor Q5 at a fixed rate.

Assuming that the dynamic resistances of the transistors Q5 and Q6 are re5 and re6, respectively, the capacitor C1 is charged until R3/(re5+re6) becomes 1, at which time the transistor Q5 is rapidly turned ON by a positive feedback operation via transistors Q5, Q7, Q8, Q6 and again Q5. In this case, the emitter of the transistor Q7 falls to L level, and the switch S1 is made ON through the NOT circuit 12 and the OR circuit 10. This in turn supplies the capacitor C1 with a constant discharge current Io, thereby dropping the base voltage of the transistor Q5 at a fixed rate. Then, the transistor Q5 is rapidly turned OFF when R3/(re5+re6) becomes 1, and the capacitor C1 is charged again by the fixed current Io in the manner described above. After that, these operations are repeated.

As a result, the triangular-wave signal A as shown in (e) of FIG. 6 is generated. Since the frequency of the triangular-wave signal A is proportional to Io/(C1×R3×I2), it can be controlled by varying the constant current Io by the control signal C. The peak voltage and the bottom voltage of the triangular-wave signal A become Vcc−2Vf, and Vcc−2Vf−R3×I2, respectively, where Vf is the base-emitter voltage of the transistors Q7 and Q8. The triangular-wave signal A is outputted from a follower buffer 11 with the DC voltage being maintained.

When the reset pulse I is inputted, the switch S1 is made ON. This places the capacitor C1 in a discharging state, and the base voltage of the transistor Q5 is being dropped. The voltage drop is stopped when the voltage across the capacitor C1 becomes Vr, where Vr is the base voltage of the transistor Q1, and is set lower than the bottom voltage of the triangular-wave signal A. This is because since the voltage across the capacitor C1 is applied to the base of the transistor Q3, the capacitor C1 is supplied with a charge current via the transistors Q1, Q2 and Q4 when the voltage across the capacitor C1 drops below Vr.

In this case, size ratios of the constant current source I1, R1/R2 and Q4/Q2 are set so that the charging current from the transistor Q4 exceeds Io. This makes it possible to keep the base voltage of the transistor Q5 near the bottom voltage Vr of the triangular-wave signal while the reset pulse is being applied. Furthermore, the pulse width T1 of the reset pulse I is set greater than half the period of the triangular-wave signal A.

Figure 8:
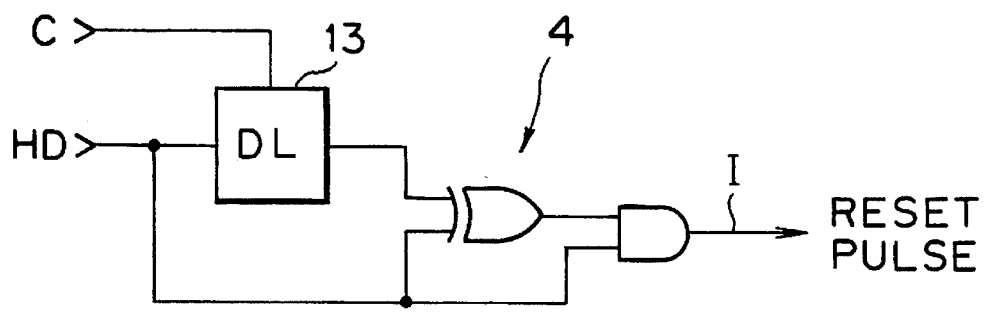
FIG. 8 is a circuit diagram showing a reset pulse generator of the first embodiment.
Figure 9:
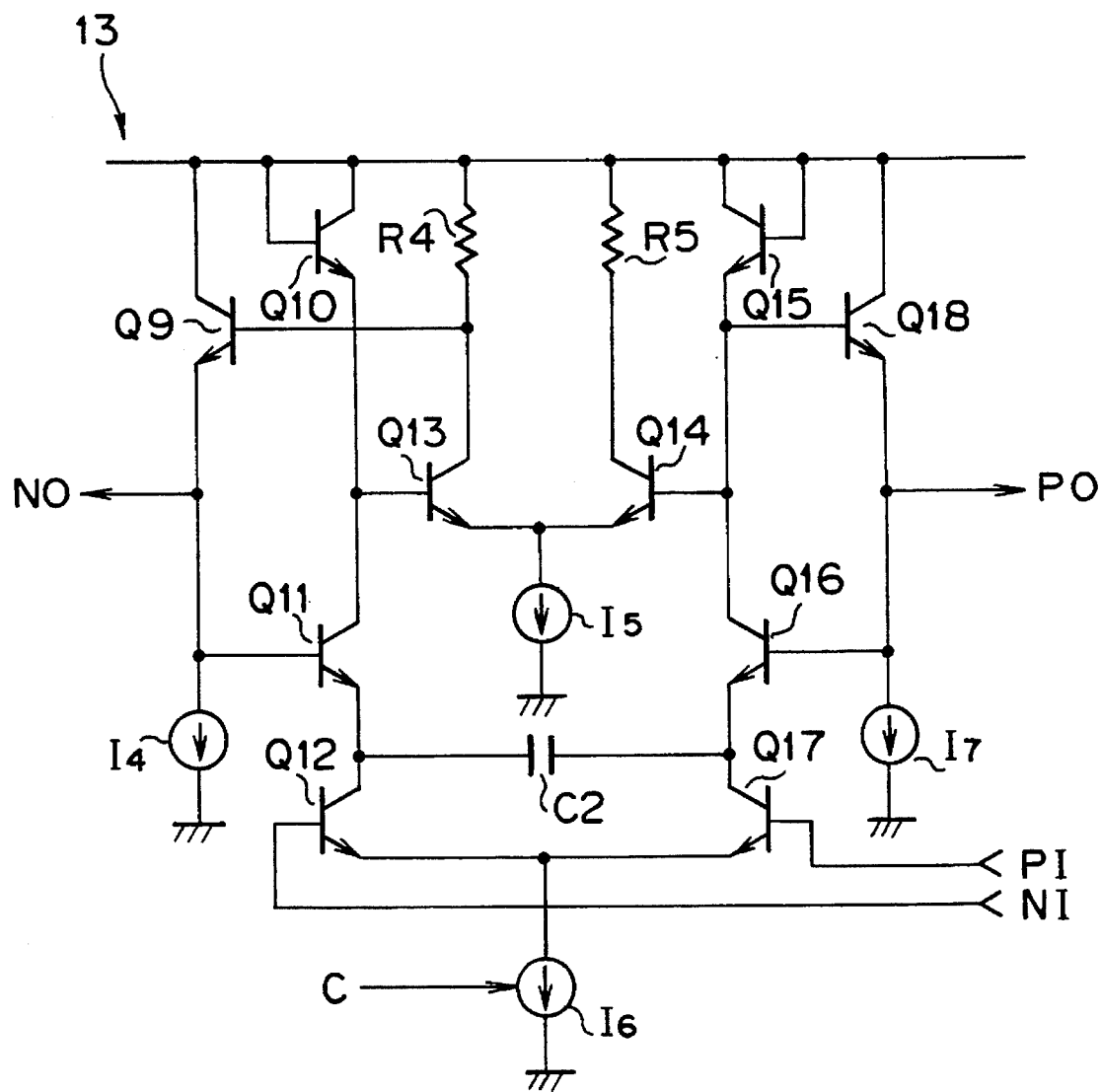
FIG. 9 is a circuit diagram showing a pulse delay circuit of the first embodiment.

FIG. 8 shows the details of the reset pulse generating circuit 4, and FIG. 9 shows a circuit example of a pulse delay line 13 in FIG. 8. The reset pulse width T1 (see, (c) of FIG. 6) is determined by the delay time of the pulse delay line 13. The delay time is proportional to (C2×R4×I5)/I6, which is analogous to the above-mentioned equation defining the frequency of the triangular-wave signal A. Accordingly, the reset pulse width T1 can be controlled by using the control signal C.

Figure 10:
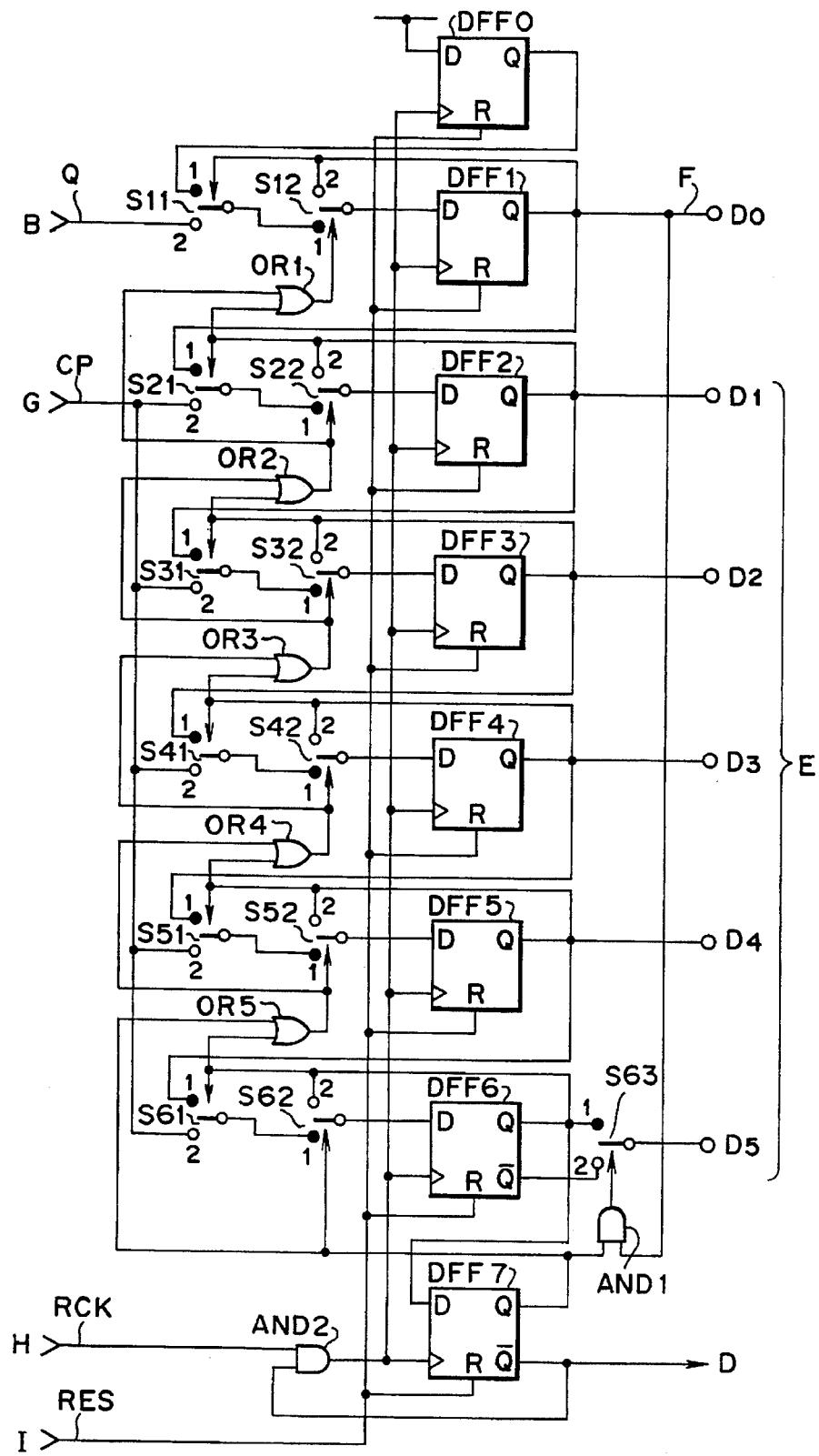
FIG. 10 is a circuit diagram showing a successive phase measuring portion of the first embodiment.

FIG. 10 is a circuit diagram of the successive phase measuring portion 5.

The successive phase measuring portion 5 sequentially reads the output G of the level comparator 8 at respective rising edges of the reference clock signal H, and holds the read data into five D flip-flops DFF2–DFF6. The output of the D flip-flops DFF2–DFF6 is supplied to the D/A converter 6 as a digital reference voltage E, and is converted into an analog reference voltage K. These reference voltages correspond to the phase difference between the triangular-wave signal A and the reference clock signal H.

In FIG. 10, seven D flip-flops DFF0–DFF6 are interconnected via switches Sk1 and Sk2, where k=1, 2, . . . , 6. Each of the switches Sk1 and Sk2 is connected to a solid circle side when an L level signal is applied to its control terminal, whereas it is connected to an open circle side when an H level signal is applied to its control terminal.

First, each switch Sk1 supplies the D flip-flop DFFk with either the signal from the D flip-flop immediately above or the signal G from the outside (or signal B in the case of the D flip-flop DFF1). More specifically, the switch Sk1 is connected to the solid circle side when the Q output of the D flip-flop DFFk is at L level, and hence, the Q output of the D flip-flop DFFk−1 immediately above is supplied to the D input of the D flip-flop DFFk. In addition, when the Q output of the D flip-flop DFFk becomes H level, the switch Sk1 is transferred to the open circle side, and hence, the external signal G or B is supplied to the D input of the D flip-flop DFFk. The switch Sk2, on the other hand, is provided for supplying the D input of the D flip-flop DFFk with either the signal from the switch Sk1 or the self-holding signal which is supplied from the Q output of the D flip-flop DFFk. More specifically, the switch Sk2 selects the output of the switch Sk1 when the output of an OR gate ORk is L level, whereas it connects the Q output of the D flip-flop DFFk to its D input in order to self-hold the Q output signal when the output of the OR gate ORk is H level.

The OR gate ORk outputs H level if at least one of the Q outputs of the D flip-flops DFFk+1, DFFk+2, . . . which are placed below the D flip-flop DFFk is at H level.

A D flip-flop DFF7 outputs a signal D which is supplied to the phase comparator 2 as shown in FIG. 5. The operation of the phase comparator 2 is held when the signal D is H level, whereas it is made active when the signal D is L level. As will be described later, the D flip-flop DFF7 continues to output H level from time t0 to time t8 of FIG. 6, so that the phase comparator 2 is held from t0 to t8.

With this arrangement, when the reset pulse I is generated at time t0 of FIG. 6, all the D flip-flops DFF0–DFF7 are reset. As a result, all the switches Sk1 and Sk2 are connected to the solid circle side.

Subsequently, the Q output of the D flip-flop DFF0 is switched to H level by the rising edge of the reference clock signal H at time t01. After that, every time the rising edge of the reference clock signal H occurs, the D flip-flop placed one position below comes to output H level from the Q output. Thus, the Q output of the D flip-flop DFF1 becomes H level at time t2, that of DFF2 becomes H level at time t3, that of DFF3 becomes H level at time t4, that of DFF4 becomes H level at time t5, that of DFF5 becomes H level at time t6, that of DFF6 becomes H level at time t7, and that of DFF7 becomes H level at time t8.

When the Q output of the D flip-flop DFFk becomes H level, the switch Sk1 is connected to the external signal G or B, and the external signal is read into the D flip-flop DFFk at the next rising edge of the reference clock signal. Thus, the signal G is read into the D flip-flops DFF2, DFF3, DFF4, DFF5, and DFF6 at times t4, t5, t6, t7, and t8, respectively, and the read signal is self-held.

For example, a signal F, which is the Q output of the D flip-flop DFF1, is determined at time t3 in FIG. 6, and is self-held by the D flip-flop DFF1. This signal F indicates whether the slope of the triangular-wave signal A is rising or falling at time t3, taking L level when the slope is rising and H level when the slope is falling. Accordingly, the switch 9 is controlled in such a way that the noninverted output of the level comparator 8 is selected at the rising slope, and the inverted output is selected at the falling slope as shown in FIG. 5.

Figure 11:
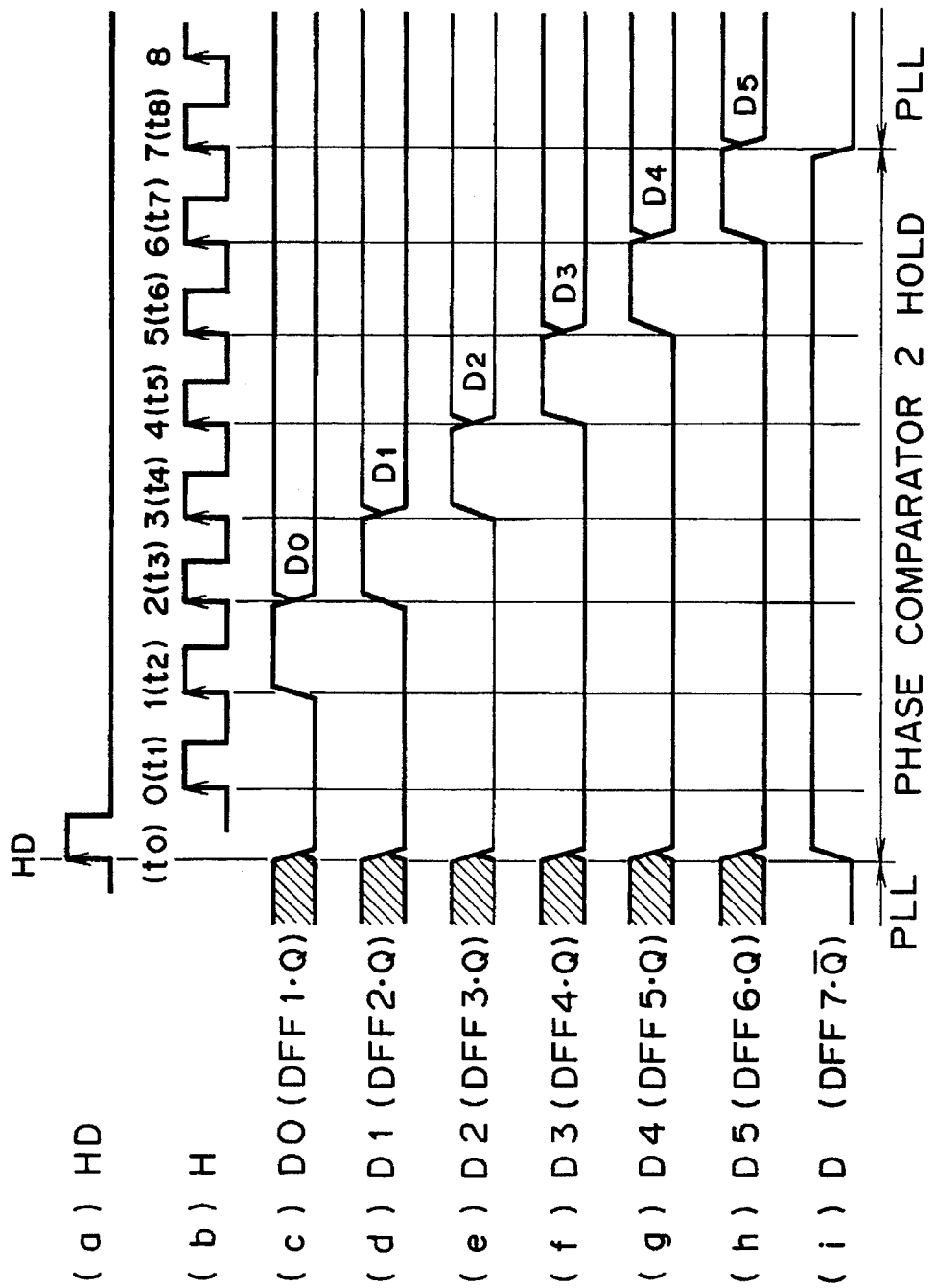
FIG. 11 is a timing diagram illustrating the operation of the successive phase measuring portion of FIG. 10.

The Q output of the D flip-flop DFF7 becomes H level at time t8, and this changes the signal D to L level as shown in (i) of FIG. 11. Since the signal F, which is the Q output of the D flip-flop DFF1, is supplied to the control terminal of the switch S63 via an AND gate AND1, the Q output of the D flip-flop DFF6 is outputted as phase data D5 when the signal F is L level, whereas the non-Q output of the D flip-flop DFF6 is outputted as the phase data D5 when the signal F is H level.

Next, the operation of the first embodiment of the phase-locked signal generator for generating the phase-locked clock signal will be described referring to the timing diagram of FIG. 6, the circuit diagram of the successive phase measuring portion 5 in FIG. 10, and the timing diagram of the successive phase measuring portion 5 in FIG. 11.

Assuming that the rising edge of the horizontal synchronizing signal HD is inputted at time t0, the reference voltage Y of (e) of FIG. 6 has been fixed at a particular value before the time t0. Here, the reference voltage Y corresponds to the reference voltage K of FIG. 5, and is determined by the preceding rising edge of the synchronizing signal HD. As will be seen from FIG. 6, the triangular-wave VCO 3 is controlled in such a way that the rising edges of the reference clock signal H and those of the output pulse G of the level comparator 8 gradually agree with each other (see (a) and (f) of FIG. 6). Thus, the frequency of the triangular-wave signal A is kept equal to that of the reference clock signal H, and hence, it is sufficiently stable.

To carry out the phase-locked control in such a way, it is preferable that the phase comparator 2 be a digital phase comparator which outputs up/down pulses. This is because it facilitates the following control. At time t0, the reset pulse generating circuit 4 begins to generate the reset pulse I, which stops the oscillation of the triangular-wave VCO 3, and completes the reset operation by the time t1. During this interval, the output signal is forced L level by the output gate 7.

In the successive phase measuring portion 5, the D flip-flops DFF0–DFF7 are reset by the rising edge of the reset pulse I, and their outputs become L level at time t0. Therefore, the output of the D/A converter 6, that is, the analog reference voltage Y (that is, K) falls to the bottom voltage of the triangular-wave signal A as shown in (e) of FIG. 6.

At the same time t0, all the switches Sk1 and Sk2 in FIG. 10 are switched to the solid circle side 1. In addition, since the phase-lock holding flag D, that is, the non-Q output of the D flip-flop DFF7 becomes H level, the phase comparator 2 is placed in the holding state. As a result, the frequency of the triangular-wave signal A is held at the same state as that before time t0. Furthermore, since the Q output of the D flip-flop DFF0 becomes H level at time t01, the D input of the D flip-flop DFF1 changes to H level.

At time t1, the reset pulse I is eliminated, and the charging operation of the capacitor C1 in the triangular-wave VCO 3 is started, thereby increasing the voltage of the triangular-wave signal A. After an interval T2, the capacitor C1 suddenly enters into the discharging operation, thereby starting the oscillation the triangular-wave signal A. The interval T2 exceeds half the period of the triangular-wave signal. The interval T1+T2 is constant as long as the control signal C is constant even if the rising edges of the horizontal synchronizing signal HD is inputted asynchronously with the reference clock signal H.

At time t2, at which the first rising edge of the reference clock signal H occurs after the elimination of the reset pulse I, the Q output of the D flip-flop DFF0 and the D input of the D flip-flop DFF1 have already been set at H level. Accordingly, the Q output of the D flip-flop DFF1 becomes H level at time t2 as shown in (c) of FIG. 11, and the switch S11 is connected to the open circle side 2. Thus, the square-wave output B from the triangular-wave VCO 3 is inputted to the D input of the D flip-flop DFF1, and the D input of the D flip-flop DFF2 is set at H level.

At time t3, at which the second rising edge of the reference clock signal H occurs, the D flip-flop DFF1 latches the square-wave output B by this edge, and the signal F (that is, D0) is outputted from the Q output of the D flip-flop DFF1 as shown in (c) of FIG. 11. The signal F indicates whether the rising edge of the reference clock signal H overlaps with the rising slope (the signal F becomes L level) or with the falling slope (the signal F becomes H level) of the triangular-wave signal A. In addition, the Q output D1 of the D flip-flop DFF2 becomes H level at time t3 as shown in (d) of FIG. 11. Hence, the switch S21 is connected to the open circle side 2, and the output G of the level comparator 8 is inputted to the D input of the D flip-flop DFF2. At the same time, the switch S12 is transferred to the open circle side 2 because the output of the OR gate OR1 becomes H level, thereby short-circuiting the D input and Q output of the D flip-flop DFF1 to self-hold its output.

Furthermore, the D input of the D flip-flop DFF2 becomes H level at time t3. Since the digital reference voltage E (=D1–D5) is 10000, the analog reference voltage K produced from the D/A converter 6 changes such that it increases toward Vpp/2 as shown in (e) of FIG. 6, where Vpp is the peak value of the triangular-wave signal. The voltage change should be completed before time t4, at which the third rising edge of the reference clock signal H occurs. Thus, the converting time of the D/A converter 6 should be within the period of the reference clock signal H.

At time t4, at which the third rising edge of the reference clock signal H occurs, the D flip-flop DFF2 latches the output G of the level converter 8. The D flip-flop DFF2 outputs at its Q output the data D1 which indicates whether the rising edge of the reference clock signal H occurs in the upper half or the lower half of the slope of the triangular-wave signal A (see (d) of FIG. 11). The H level data D1 indicates that the rising edge of the reference clock signal H occurs in the upper half, whereas the L level data D1 indicates that it occurs in the lower half. In FIG. 6, the data D1 becomes H level. At the same time, the Q output of the D flip-flop DFF3, that is, the data D2 becomes H Level as shown in (e) of FIG. 11, and hence, the switch S31 is connected to the open circle side 2. Thus, the output G from the level comparator 8 is supplied to the D input of the D flip-flop DFF3, and the D input of the D flip-flop DFF4 becomes H level.

In addition, since the switch S22 is connected to the open circle side 2 because of the H level outputted from the OR gate OR2 at time t4, the D input and the Q output of the D flip-flop DFF2 is short-circuited, thereby putting the D flip-flop DFF2 in the self-holding state. Furthermore, since the data D2 which is the output of the D flip-flop DFF3 becomes H level at this time t4, the switch S12 continues to be connected to the open circle side 2, and hence, the D flip-flop DFF1 maintains the self-holding state.

The digital reference voltage E (that is, D1–D5) becomes 11000, and hence, the analog reference voltage K further increases toward (½+¼)Vpp (the middle voltage of the upper half of the slope of the triangular-wave signal A), that is, a further increment of Vpp/4 as shown in (e) of FIG. 6. The voltage change should be completed before time t5, at which the fourth rising edge of the reference clock signal H is inputted.

At time t5, at which the fourth rising edge of the reference clock signal H occurs, the D flip-flop DFF3 latches the output G of the level comparator 8. The D flip-flop DFF3 outputs at its Q output the data D2 which indicates whether the rising edge of the reference clock signal H occurs in the upper half or the lower half of the ¼ region of the slope of the triangular-wave signal A (see (e) of FIG. 11). At this time t5, the data D2 becomes L level as shown in (e) of FIG. 6.

As in the preceding operation, the Q output of the D flip-flop DFF4 becomes H level as shown in (f) of FIG. 11, the output G of the level comparator 8 is supplied to the D input of the D flip-flop DFF4, the D input of the D flip-flop DFF5 becomes H level, and the D flip-flop DFF3 enters the self-holding state. The D flip-flops DFF1 and DFF2 also keep the self-holding state. The digital reference voltage E (=D1–D5) becomes 10100, and the analog reference voltage K changes toward the voltage (½+⅛)Vpp as shown in (e) of FIG. 6.

In this way, the other phase measuring data D3–D5 are sequentially determined, and the rising edge of the output G of the level comparator 8 is successively approximated to the rising edge of the reference clock signal H as shown in (f) of FIG. 6.

At time t8, at which the seventh rising edge of the reference clock signal H occurs, and the least significant bit D5 of the phase measuring data D1–D5 is determined by self-holding the D flip-flop DFF6, the non-Q output of the D flip-flop DFF7 becomes L level as shown in (i) of FIG. 11. Accordingly, the output of the AND gate AND2 is forced to L level, and hence, the reference clock signal H is not inputted to the D flip-flops DFF0–DFF7. As a result, the phase measuring data D0–D5, that is, the signal F and the digital reference voltage E are held, and this holding state is maintained until the next rising edge (trigger signal) of the horizontal synchronizing signal HD occurs.

At time t8, since the phase-lock holding flag D becomes L level as shown in (i) of FIG. 11, the phase comparator 2 starts the phase comparing operation, and controls the triangular-wave VCO 3 in such a manner that the pulse edges of the output of the switch 9 (in this case, the rising edge of the pulse G) agree with the edges (in this case, the rising edges) of the reference clock signal H. Since the edges of the output pulse from the level comparator 8 have already been approximated to the edges of the reference clock signal H as shown in (f) of FIG. 6, the phase compensation amount of the triangular-wave signal A is small, and the time required to complete the phase compensation can be shortened. Therefore, the amount of phase fluctuations (jitter amount) of the square-wave output of the triangular-wave VCO 3 from time t8 can also be reduced to a small amount. In this embodiment, the jitter amount is less than 1/64 of the period of the triangular-wave signal A.

In summary, since the time interval T1+T2 from the input of the rising edge (trigger signal) of the horizontal synchronizing signal HD at time t0 to the output of the square-wave output B at time t21 in FIG. 6 is constant, the jitter amount of the edge of the first pulse of the square-wave output B can be reduced to a very small amount.

In addition, the phase comparator 2 is in the holding state, and its output C is constant until time t8, at which the successive phase measuring is completed. Therefore, there are cumulative phase fluctuations due to the frequency fluctuations of the triangular-wave VCO 3. The time interval for the phase measuring, however, is short such as 6 to 7 clock intervals in this embodiment, and hence, the phase fluctuations can be readily limited within a few degrees. A possibility that the jitter amount of the square-wave signal B after time t8 is degraded by the phase fluctuations will be very small, because the phase fluctuation characteristics are similar for each edge of the horizontal synchronizing signal HD (although the successive phase measuring interval varies one clock interval at most), and the least significant bit D5 of the phase measuring data is detected at time t8 taking account of the phase fluctuation amount. Consequently, the square-wave signal B can be used as the phase-locked signal.

EMBODIMENT 2

In order that the phase-locked signal generator of the first embodiment operates normally, it is necessary that the level comparator 8 output a pulse signal without fail for any digital reference voltage D1–D5, and the successive phase measuring portion 5 be operated normally by the pulse signal.

It is difficult, however, to accurately define the dynamic range of the D/A converter 6 within the peak voltage and the bottom voltage of the triangular-wave signal A produced from the triangular-wave VCO 3. In addition, when the trigger edge of the synchronous signal occurs near the peak voltage or the bottom voltage of the triangular-wave signal, the width of the output pulses of the level comparator 8 falls very narrow. This makes it difficult to stably operate the successive phase measuring portion 5 and the phase comparator 2 which include logic circuit.

Figure 12:
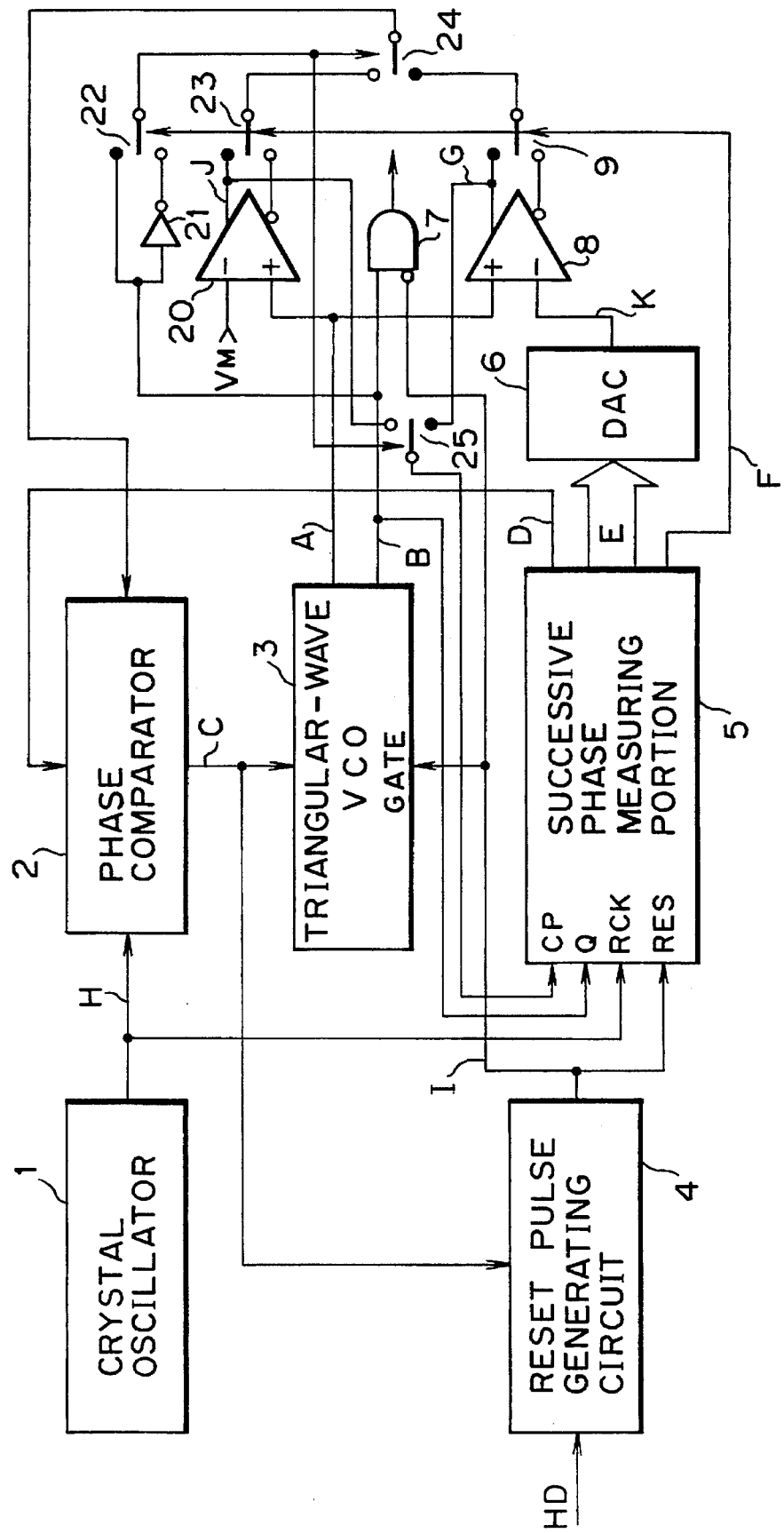
FIG. 12 is a block diagram showing a second embodiment of the phase locked signal generator in accordance with the present invention.

The second embodiment provides a phase-locked signal generator as shown in FIG. 12, which can eliminate this problem.

Differences between the second embodiment and the first embodiment as shown in FIG. 5 will be described referring to the timing diagram of FIG. 13. In this embodiment, the triangular-wave signal A is inputted to a level comparator 20, and is compared with a voltage $V_M$ which is substantially the central voltage of the triangular-wave signal A as shown in (a) of FIG. 13. The level comparator 20 outputs a pulse signal J as shown in (c) of FIG. 13, and supplies it to the phase comparator 2 through a switch 23 controlled by the signal F (phase data D0) and a switch 24.

The square-wave signal B outputted from the triangular-wave VCO 3 controls the switch 24 via a NOT circuit 21 and a switch 22 which is controlled by the signal F.

The noninverted output G of the level comparator 8 and the noninverted output J of the level comparator 20 are inputted to a switch 25, and the output of the switch 25 is supplied to the CP input of the successive phase measuring portion 5. The level comparator 8 outputs the pulse signal G as shown in (d) of FIG. 13 in response to the reference voltage D1–D5. In this figure, the shaded portions represent intervals in which the pulse signal G is present. As will be seen in this figure, the pulse signal G may be omitted near the vertices of the triangular-wave signal A.

In this embodiment, such omission of pulses of the signal G is eliminated by preventing the pulse width of the signal G as shown in (d) of FIG. 6 from being narrowed too much. The signal G has either H or L level at time tk (k=3–8) in FIG. 6, and the pulse width thereof may be widened as long as the level value is maintained. More specifically, the pulse width of the signal G can be widened while satisfying this condition by broadening the pulse width in the falling slope interval of the triangular-wave signal A when the signal F is L level, and by broadening the pulse width in the rising slope interval of the triangular-wave signal A when the signal F is H level.

Figure 13:
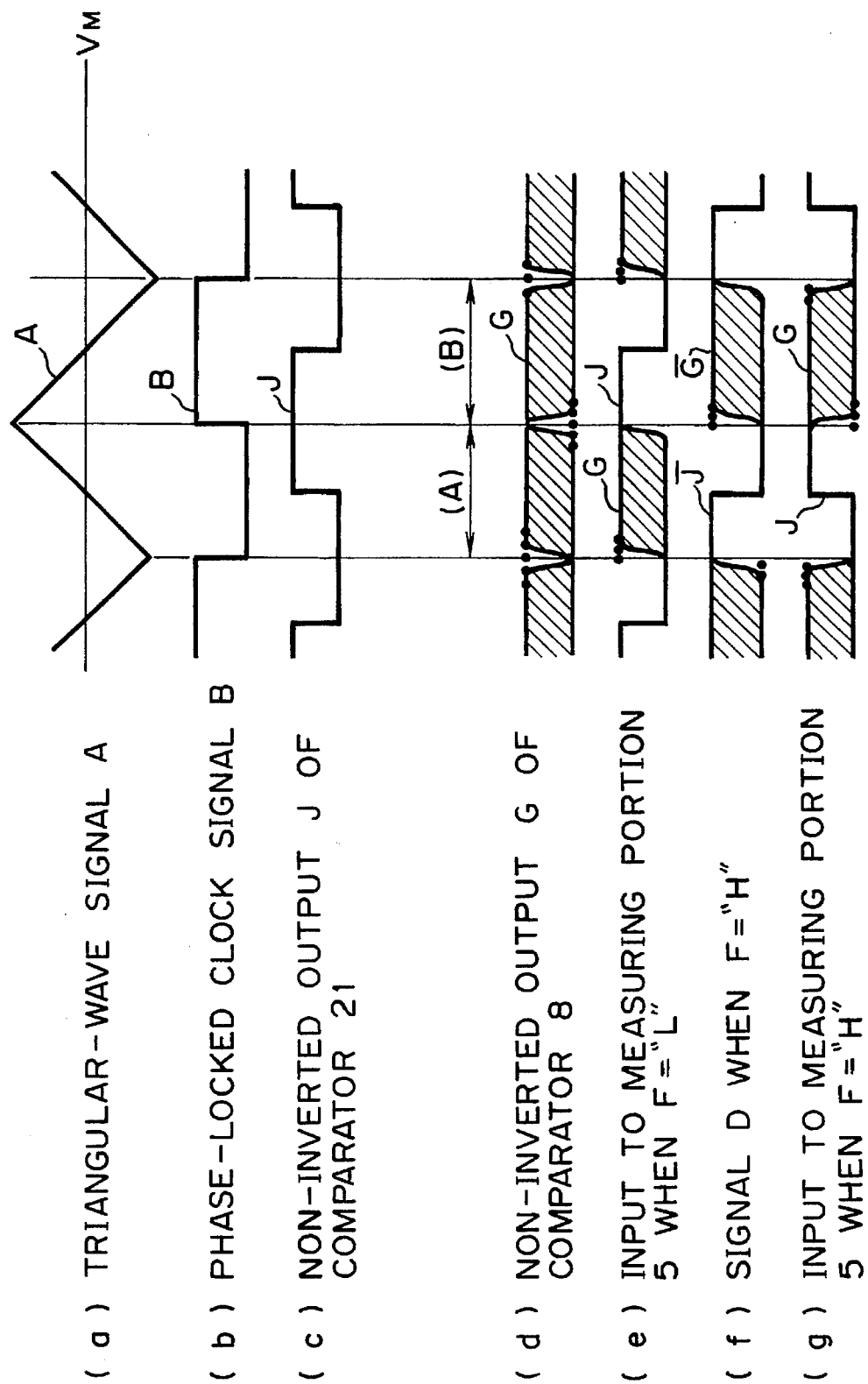
FIG. 13 is a timing diagram illustrating the operation of the second embodiment of FIG. 12.

When the signal F (that is, the phase data D0) is L level, the successive phase measuring operation and the phase comparing operation are performed in the interval (A) of FIG. 13. As shown in (e) of FIG. 13, the input to the successive phase measuring portion 5 is forcedly switched to the pulse signal J in the interval (B). This makes it possible to prevent omission of the pulse signal G, and to establish pulse widths that can ensure the operation of the logic circuits. Even if a pulse of the output signal G of the level comparator 8 might be omitted, the phase measuring error can be suppressed to a minimum value. When the signal F is L level, the pulse signal J as shown in (e) of FIG. 13 is also inputted to the phase comparator 2. This also makes it possible to limit the jitter due to the omission of the pulse signal G to a minimum.

On the other hand, when the signal F is H level, the successive phase measuring operation and the phase comparing operation are carried out in the interval (B) of FIG. 13. In this case, the pulse signal J+G as shown in (g) of FIG. 13 is inputted to the successive phase measuring portion 5, thereby limiting phase measuring error due to the omission of the pulse signal G to a minimum amount. Likewise, the pulse signal as shown in (f) of FIG. 13 is inputted to the phase comparator 2 in order to suppress the jitter to a minimum amount.

The circuit operation described above eliminates the strict restriction on the dynamic range of the D/A converter 6. Thus, the dynamic range can be set at any voltage range as long as the voltage range includes the triangular-wave signal A. Although the wide dynamic range will increase the phase measuring error and the jitter amount, they can be suppressed within about 20%. In addition, since the minimum pulse width of the level comparator 8 can be set at least 4% of the clock period, the jitter amount can be suppressed below $1/50$ T, where T is the clock period.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A phase-locked signal generator producing a phase-locked clock signal in phase with a trigger signal, comprising:

reference clock signal generating means for generating a reference clock signal having the same frequency as the phase-locked clock signal;

reset pulse generating means for generating a reset pulse in response to the trigger signal;

triangular-wave generating means for generating a triangular-wave signal, whose frequency is identical to that of the phase-locked clock signal, from a particular phase after a predetermined time has elapsed from the input of the trigger signal, said triangular-wave generating means suspending its oscillation for the predetermined time in response to the reset pulse;

phase detecting means for detecting a phase difference between the triangular-wave signal and the reference clock signal, and for holding the detected phase difference; and phase control means for controlling said triangular-wave generating means after the phase detection by said phase detecting means, so that the phase difference between the reference clock signal and the triangular-wave signal is maintained at the phase difference held by the phase detecting means, wherein said phase detecting means comprises:

a first comparator comparing the triangular-wave signal with reference voltage, and outputting the comparison result in the form of a digital signal;

holding means for sequentially holding the digital signal outputted from said first comparator at a particular phase of the reference clock signal during a phase detecting period, and for outputting held digital signals as a digital reference voltage; and a D/A converter converting the digital reference voltage outputted from the holding means into an analog signal, and outputting the analog signal as the reference voltage, wherein the reference voltage is controlled to successively approximate a voltage of the triangular-wave signal at the particular phase of the reference clock signal.

2. The phase-locked signal generator as claimed in claim 1, wherein said holding means acquires the output of said first comparator by a predetermined number of times after the occurrence of the reset pulse, and determines the reference voltage after the last acquisition.

3. The phase-locked signal generator as claimed in claim 2, wherein the phase control means comprises a phase comparator which detects a phase difference between the output of said first comparator and the reference clock signal after the reference voltage has been determined, and which supplies said triangular-wave generating means with a control signal corresponding to the phase difference which has been detected by the phase comparator.

4. The phase-locked signal generator as claimed in claim 3, wherein said phase comparator is set in a hold state in response to the reset pulse, said phase comparator holding the control signal in the hold state, and wherein said reset pulse generating means controls the pulse width of the reset pulse by the control signal held by the phase comparator.

5. The phase-locked signal generator as claimed in claim 3, wherein said triangular-wave generating means comprises a capacitor, and a constant current source supplying a constant current to the capacitor, the constant current being controlled by the control signal outputted from the phase comparator.

6. The phase-locked signal generator as claimed in claim 5, wherein said triangular-wave generating means generates both the triangular-wave signal and the phase-locked clock signal.

7. The phase-locked signal generator as claimed in claim 1, wherein said first comparator is a binary comparator that outputs a binary signal.

8. The phase-locked signal generator as claimed in claim 7, further comprising a second comparator comparing the triangular-wave signal with a central voltage of the triangular-wave signal, and a first switch supplying the phase detecting means with one of the outputs of the first comparator and the second comparator, wherein the pulse width of the first comparator is broadened without changing a value of the output of the first comparator at the particular phase of the reference clock signal.

9. An apparatus for generating a clock signal whose phase is synchronized with a trigger signal, said apparatus comprising:

means for generating a reference clock signal;

means for generating a first clock signal whose frequency is variably controlled, and whose phase is in phase with said trigger signal;

phase detecting means for detecting a phase difference between the first clock signal and the reference clock signal in response to the trigger signal;

means for generating a second clock signal, a phase difference of said second clock signal from that of the first clock signal being variably set;

means for setting the phase difference of the second clock signal from the first clock signal in accordance with the phase difference detected by said phase detecting means; and means for comparing the phase of the second clock signal, with which the phase difference from said first clock signal is set, with the phase of the reference clock signal, and for controlling the frequency of the first clock signal.

10. The apparatus claimed in claim 9, wherein said trigger signal is periodically outputted, and said means for generating a first clock signal generates, during an interval from an input of the trigger signal to detection of said phase by said phase detecting means, the first clock signal with a frequency determined by said means for comparing, said frequency of said first clock signal being determined before the input of the trigger signal.

11. The apparatus claimed in claim 9, wherein said means for generating a first clock signal generates a triangular wave signal, said means for generating a second clock signal includes means for comparing said triangular wave signal with a level signal corresponding to said phase difference.

12. The apparatus claimed in claim 9, wherein said means for generating a reference clock signal comprises a crystal oscillator, and said means for generating a first clock signal comprises a voltage controlled oscillator.

13. A laser beam printer including the apparatus claimed in claim 9.

* * * * *

UNITED STATES PATENT AND TRADEMARK OFFICE
CERTIFICATE OF CORRECTION

PATENT NO. : 5,493,256

DATED : February 20, 1996

INVENTOR(S) : Somei Kawasaki, et al.

Page 1 of 2

It is certified that error appears in the above-identified patent and that said Letters Patent is hereby corrected as shown below:

ON THE TITLE PAGE:

AT [54] TITLE

"PHASE LOCKED" should read --PHASE-LOCKED--.

COLUMN 1

Line 1, "PHASE LOCKED" should read --PHASE-LOCKED--.

COLUMN 2

Line 48, "invention" should read --invention is--.

COLUMN 4

Line 19, "invent ion," should read --invention,--.

COLUMN 5

Line 21, "invent ion;" should read --invention;--.

COLUMN 9

Line 60, "forced" should read --forced to--.

UNITED STATES PATENT AND TRADEMARK OFFICE
CERTIFICATE OF CORRECTION

PATENT NO. : 5,493,256

DATED : February 20, 1996

INVENTOR(S) : Somei Kawasaki, et al.

Page 2 of 2

It is certified that error appears in the above-identified patent and that said Letters Patent is hereby corrected as shown below:

COLUMN 10

Line 20, "edges" should read --edge--.

COLUMN 11

Line 59, "DO-D5," should read --D0-D5,--.

COLUMN 14

Line 34, "reference" should read --a reference--.

Signed and Sealed this

Sixth Day of August, 1996

Attest:

BRUCE LEHMAN

Attesting Officer

Commissioner of Patents and Trademarks